(12) United States Patent
Chang

(10) Patent No.: US 8,765,608 B2
(45) Date of Patent: Jul. 1, 2014

(54) METHODS FOR FORMING TRENCHES

(75) Inventor: Ya Hui Chang, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 109 days.

(21) Appl. No.: 13/460,971

(22) Filed: May 1, 2012

(65) Prior Publication Data
US 2013/0295755 A1    Nov. 7, 2013

(51) Int. Cl.
   *H01L 21/311* (2006.01)
(52) U.S. Cl.
   USPC .... 438/700; 438/680; 438/692; 257/E21.006; 257/E21.027; 257/E21.058; 257/E21.134; 257/E21.151; 257/E21.17; 257/E21.218; 257/E21.227; 257/E21.311; 257/E21.229; 257/E21.278; 257/E21.293; 257/E21.304; 257/E21.548; 257/E21.549
(58) Field of Classification Search
   USPC .............. 438/700, 680, 311, 692, 712, 745, 9
   See application file for complete search history.

(56) References Cited

U.S. PATENT DOCUMENTS

| | | | | |
|---|---|---|---|---|
| 6,093,600 A | * | 7/2000 | Chen et al. | 438/243 |
| 6,624,464 B2 | * | 9/2003 | Shin et al. | 257/314 |
| 6,750,117 B1 | * | 6/2004 | Hung et al. | 438/437 |
| 6,939,780 B2 | * | 9/2005 | Yun et al. | 438/437 |
| 7,518,210 B2 | * | 4/2009 | Yun et al. | 257/506 |
| 8,435,824 B2 | * | 5/2013 | Tsai et al. | 438/65 |

OTHER PUBLICATIONS

Unpublished U.S. Appl. No. 13/343,818, filed Jan. 5, 2012 entitled "Device and Methods for Small Trench Patterning," 18 pages.
Unpublished U.S. Appl. No. 13/343,771, filed Jan. 5, 2012 entitled "Device and Methods for Forming Partially Self-Aligned Trenches," 19 pages.

* cited by examiner

*Primary Examiner* — David Nhu
(74) *Attorney, Agent, or Firm* — Haynes and Boone, LLP

(57) ABSTRACT

Methods for making a semiconductor device are disclosed. The method includes forming a plurality of gate stacks on a substrate, forming an etch buffer layer on the substrate, forming a dielectric material layer on the etch buffer layer, forming a hard mask layer on the substrate, wherein the hard mask layer includes one opening, and etching the dielectric material layer to form a plurality of trenches using the hard mask layer and the etch buffer layer as an etch mask.

19 Claims, 4 Drawing Sheets

METHODS FOR FORMING TRENCHES

BACKGROUND

As the integrated circuit (IC) fabrication moves to advanced technology nodes, the IC feature size scales down to smaller dimensions. For example, the trench dimensions and gate sizes continue to get smaller and smaller. One limitation to achieving smaller sizes of IC device features is conventional lithography. Small trench formation typically requires a high cost exposure tool, such as extreme ultraviolet (EUV) lithography tools that are constrained by scanner wavelength and various patterns for blocking certain wavelengths. A large etching bias is generally required to compensate for the large lithographic pattern for non-shrinkable critical dimensions, which often results in poor critical dimension uniformity or shorting of the gate when blocking patterns are misaligned. Thus, better and simpler methods and materials are needed to define small trench dimensions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
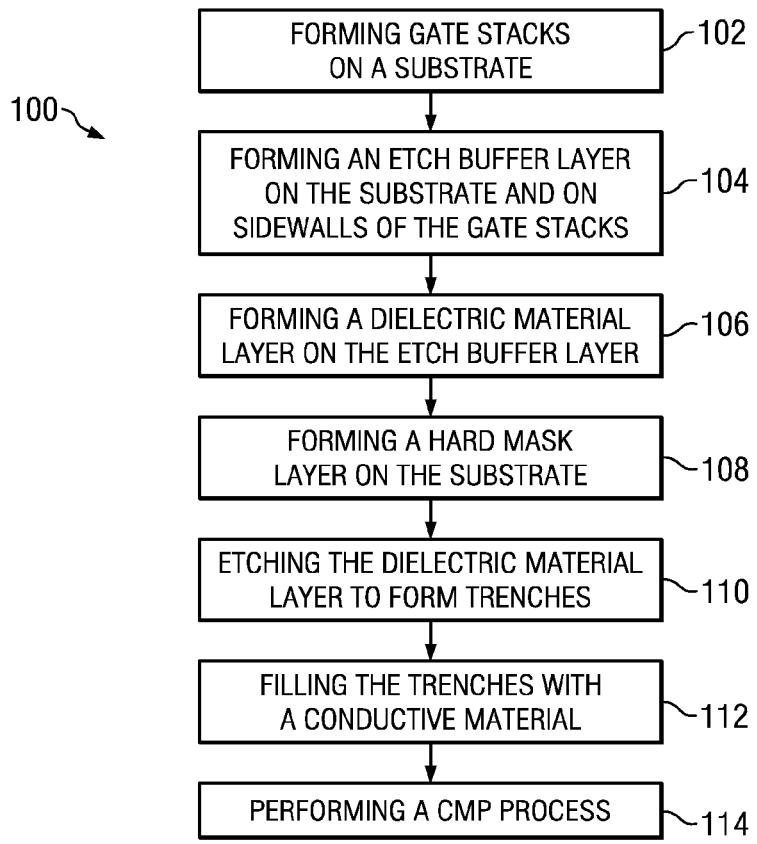
FIG. 1 is a flowchart of a method of making a semiconductor device according to various aspects of the present disclosure in one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of an embodiment of a method 100 for making a semiconductor device constructed according to various aspects of the present disclosure in one or more embodiments. FIGS. 2 through 5 are sectional views of a semiconductor device 200 at various fabrication stages and constructed according to one or more embodiments. The semiconductor device 200 and the method 100 of making the same are collectively described with reference to FIGS. 1 through 5.

Figure 2:
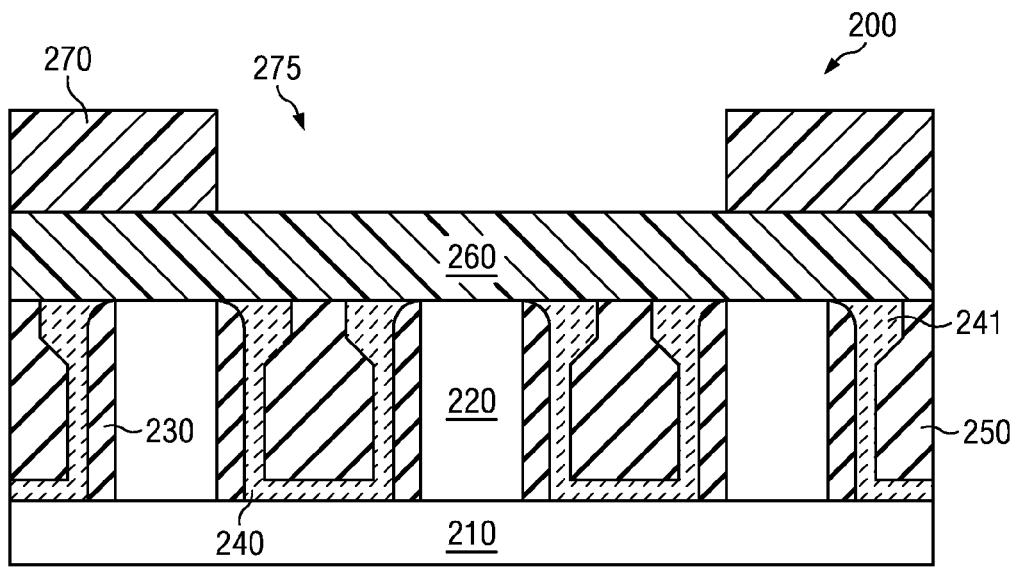
FIGS. 2-3 are sectional views of one embodiment of a semiconductor substrate at various fabrication stages constructed according to various aspects of the present disclosure in one or more embodiments.
Figure 3:
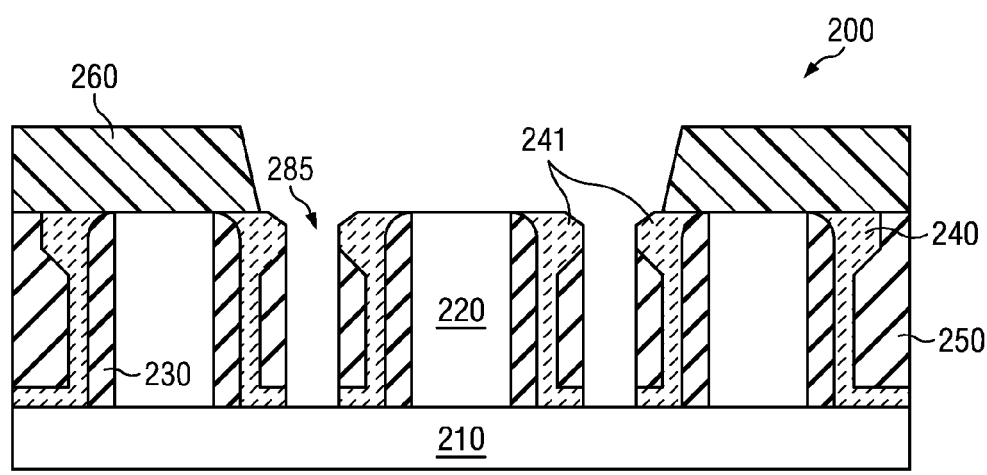
Figure 4:
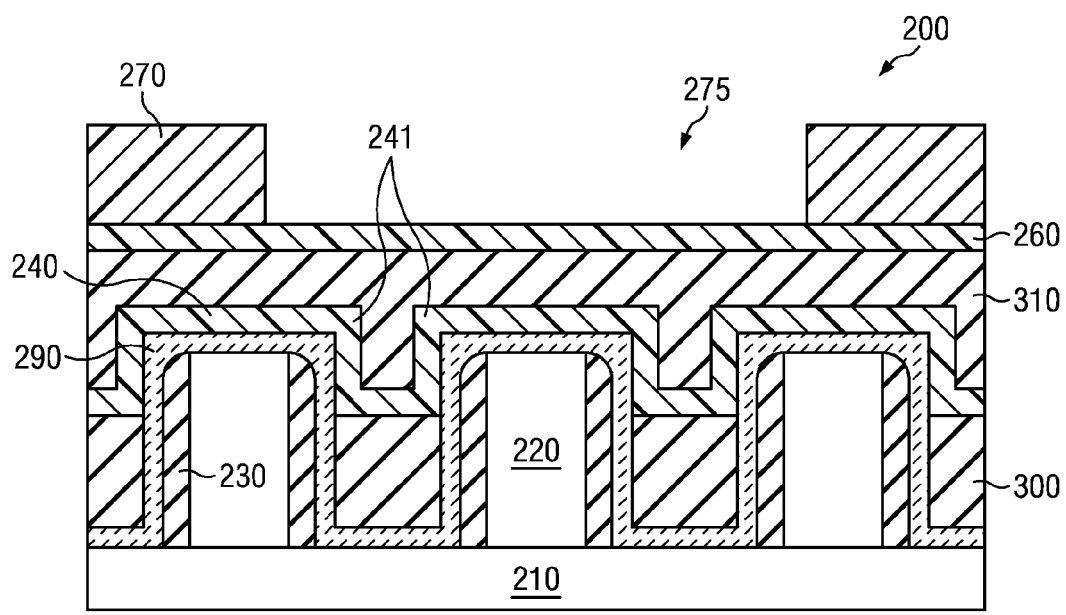
FIGS. 4-5 are sectional views of another embodiment of a semiconductor substrate at various fabrication stages constructed according to various aspects of the present disclosure in one or more embodiments.
Figure 5:
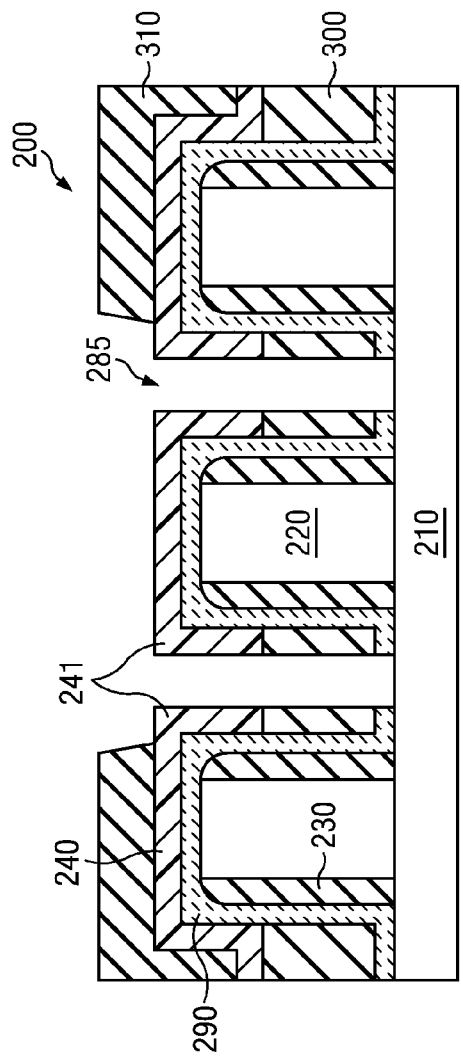

The method 100 begins at step 102 by forming gate stacks on a semiconductor substrate 210. Two embodiments of the device 200 are provided herein for use with the present methods. One embodiment is shown in FIGS. 2 and 3, and another embodiment is illustrated in FIGS. 4 and 5. Both embodiments are discussed in detail herein.

The device 200 shown in FIGS. 2-5 includes a semiconductor substrate 210. The substrate 210 may include germanium, silicon germanium or other appropriate semiconductor materials. Also alternatively, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and materials.

The substrate 210 may also include various features including doped regions and source and drain (S/D) regions. The doped regions may be p-wells and n-wells (not shown), formed by implantation techniques. The S/D regions (not shown) are formed by any proper technique, such as one or more ion implantations.

Still referring to FIGS. 2-5, the semiconductor device 200 includes a gate structure 220 formed by deposition, pattern and etch techniques. The gate structure 220 may include a dummy gate structure. A dummy gate structure refers to a gate structure which will be replaced with a metal gate in subsequent processes. The dummy gate structure may includes a dummy gate layer, such as polysilicon, amorphous silicon or other appropriate material.

Gate sidewall spacers 230 are formed on the sidewalls of the gate structure 220. The gate sidewall spacers 230 generally include a dielectric material such as silicon nitride (Si3N4). Alternatively, the gate sidewall spacers 230 may include silicon nitride, silicon oxide, silicon dioxide (SiO2), SiC, oxynitride (SiON), or combinations thereof. Typical formation methods for the gate spacers 230 include depositing a dielectric material over the gate structure 220 and then anisotropically etching back the dielectric material.

Now referring to FIGS. 2 and 3 and step 104, an etch buffer layer 240 is formed over the sidewall spacer 230. In FIG. 2, the etch buffer layer includes a shoulder or overhang component 241 that includes an upper edge that extends laterally from the sidewall spacer 230. The width between adjacent upper edges 241 is narrower than the width between adjacent sidewall spacers 230. In other words, the width of the etch buffer layer 240 at the upper portion of the sidewall spacer 230 is greater than the width of the etch buffer layer 240 at the lower portion of the sidewall spacer 230. The adjacent upper edges 241 provide a partial self-alignment of trench patterns for future trench formation. Advantageously, the narrow spacing between adjacent upper edges 241 results in smaller critical dimensions (CD) for the trenches The etch buffer layer 240 may be selected to include a material with high etching resistance that is not intended to be etched or removed. In an exemplary embodiment, the etch buffer layer 240 has a slower etch rate than an interlayer dielectric (ILD) layer 250 (described below). By providing materials with different etch rates, highly selective etching may be achieved to form trenches with smaller CD.

The etch buffer layer 240 may include may include silicon nitrides ($Si_xN_y$) such as $Si_3N_4$, silicon oxide, SiON, SiOC, SiNC, metal oxides, and/or other suitable materials. The etch buffer layer 240 may be formed by atomic layer deposition (ALD), chemical vapor deposition (CVD), plasma-enhanced chemical vapor deposition (PECVD), physical vapor deposition (PVD), and/or other deposition processes known in the art. Pressure and gases applied during the deposition process are controlled to form the overhang component 241. Suitable gases that may be used in the deposition process include silane ($SiH_4$), ammonia ($NH_3$), tetramethylsilane (TMS), or combinations thereof.

Still referring to FIG. 2 and moving to step 106, an ILD layer 250 is formed on the etch buffer layer 240. The ILD layer 250 may be formed by CVD, high density plasma CVD, spin-on methods, sputtering, and/or other suitable methods. The ILD layer 250 typically includes silicon oxide, silicon dioxide, SiON, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In the present embodiment, the ILD layer 250 is selected to have a high etch rate compared with the etch buffer layer 240.

A chemical mechanical polishing (CMP) process is performed subsequently to remove excess ILD layer 250 such that, for example, the overhang component 241 is exposed. The CMP process may polish off the top of the etch buffer layer 240 or may stop at the top of the etch buffer layer 240, for a better CMP process control. In another embodiment, the ILD layer 250 may be redeposited on the top of the planarized structure.

In step 108, a hard mask layer 260 is formed on the substrate 210. A hard mask layer 260 and photoresist layer 270 are used to form a plurality of trenches. For example, a hard mask layer 260, such as a titanium nitride, is formed and is further patterned to form various openings using a lithography process. The hard mask layer 260 is patterned with one opening through which a plurality of trenches are etched. The hard mask layer 260 is described in more detail below.

In FIG. 3 and step 110, the ILD layer 250 is etched to form a plurality of trenches 285. The hard mask layer 260 and the etch buffer layer 240 function as an etch mask during the etching process. In step 112, the trenches 285 are filled with a conductive material, such as one or more metals, resulting in contact features, metal plugs, or local inter-connection features to connect active regions and gates. In step 114, a CMP process is then performed to remove excessive conductive material formed on the ILD layer 250 and the hard mask layer 260 and to further planarize the top surface of the ILD layer 250.

Now referring to FIGS. 4 and 5, which shows a different embodiment than that illustrated in FIGS. 2 and 3, an etch stop layer 290 is formed over the sidewall spacer 230. The etch stop layer 290 may include silicon nitrides ($Si_xN_y$) such as $Si_3N_4$, silicon oxide, SiON, silicon oxycarbide (SiOC), silicon nitrocarbon (SiNC), metal oxides, and/or other suitable materials. Known processes are used to deposit the etch stop layer 290 over the sidewall spacers 230. The etch stop layer 290 acts to stop or slow down a future etch process. When etching reaches the etch stop layer 290, etching is minimal.

A first ILD layer 300 is formed on the etch stop layer 290. The first ILD layer 300 may be formed by CVD, high density plasma CVD, spin-on methods, sputtering, and/or other suitable methods. The first ILD layer 300 typically includes an oxide such as silicon oxide, silicon dioxide, SiON, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In the present embodiment, the first ILD layer 300 is selected to have a high etch rate compared with the etch buffer layer 240 (described below).

Still referring to FIG. 4, a CMP process is performed subsequently to remove excess first ILD layer 300. The CMP process provides a substantially planar surface for the gate structure 220 and the first ILD layer 300.

The first ILD layer 300 is etched back to expose an upper portion of the etch stop layer 290. The first ILD layer 300 is removed by an etch technique such as plasma etching, dry etch, wet etch, or combinations thereof.

Next, an etch buffer layer 240 is formed over the etch stop layer 290 and the first ILD layer 300. The etch buffer layer 240 may be selected to include a material with high etching resistance that is not intended to be etched or removed, or to be etched at a rate much slower than the first ILD layer 300 and/or second ILD layer 310 (discussed below). In an exemplary embodiment, the etch buffer layer 240 has a slower etch rate than the second ILD layer 310.

The etch buffer layer 240 includes upper edges 241 that define a width or space therebetween. The space between adjacent upper edges 241 is narrower than the space between adjacent sidewall spacers 230. The adjacent upper edges 241 provide a partial self alignment of trench patterns for future trench formation.

The etch buffer layer 240 may include may include silicon nitrides ($Si_xN_y$) such as $Si_3N_4$, silicon oxide, SiON, SiOC, SiNC, metal oxides, and/or other suitable materials. The etch buffer layer 240 may be formed by ALD, CVD, plasma-enhanced chemical vapor deposition (PECVD), physical vapor deposition (PVD), and/or other deposition processes known in the art.

In FIGS. 4 and 5, a second ILD layer 310 is deposited over the etch buffer layer 240. The second ILD layer 310 may be formed of the same material as the first ILD layer 300, or may be a different material. In an exemplary embodiment, the first ILD layer 300 and second ILD layer 310 are formed of the same material.

After the etch buffer layer 240 is formed, a hard mask layer 260 and patterned photoresist layer 270 are used to form a plurality of trenches 285, which is further described below and shown in FIG. 5. As seen in FIG. 5, the second ILD layer 310 includes one opening through which a plurality of trenches can be etched. The trenches 285 are filled with a conductive material, such as one or more metals, resulting in contact features, metal plugs, or local inter-connection features to connect active regions and gates. In one embodiment, tungsten is used to fill in the trenches 285 to form tungsten plugs. Other metals, such as copper or aluminum, may be used to form metal plugs. Another CMP process is performed to remove excessive conductive material formed on the second ILD layer 310 and to further planarize the top surface of the second ILD layer 310.

Going back to FIG. 2, the photoresist layer 270 is patterned to have one opening 275. The pattern of the photoresist layer 270 is transferred to the hard mask layer 260. Traditionally, the hard mask layer 260 includes several openings that define regions for trenches, i.e., a single opening defines a single trench. Because of the partial self-alignment and selective etching of the substrate (discussed below), the hard mask layer 260 does not require several openings through which trenches can be etched, but only one opening. The hard mask layer 260 and etch buffer layer 240 function as the etch mask. In the present methods, etching through the one opening in the hard mask layer 260 forms a plurality of trenches instead of a single trench. Thus, the trenches are not defined by the pattern of the hard mask layer 260.

Going back to FIG. 4, the resist layer 270 is patterned to have one opening 275. The pattern of the photoresist layer 270 is transferred to the hard mask layer 260. In the present methods, etching through the one opening in the hard mask layer 260 forms one opening in the second ILD layer 310. The second ILD layer 310 and the etch buffer layer 240 function as the etch mask during the etching process. The trenches are not defined by the pattern of the hard mask layer 260 or second ILD layer 310.

Figure 6:
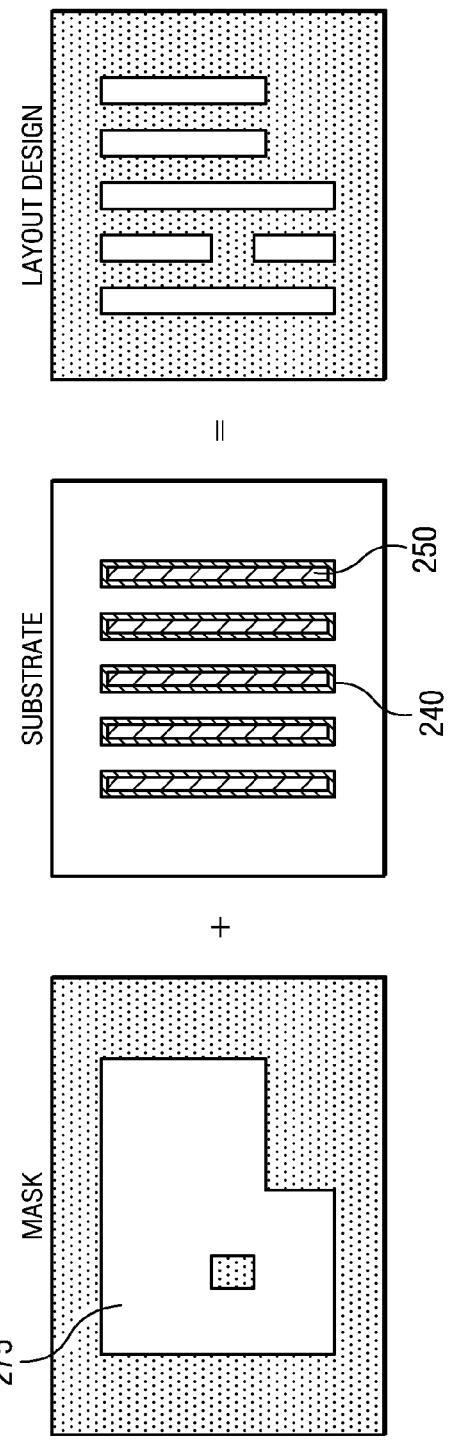
FIG. 6 is an illustration of a specific layout design formed from a mask and substrate according to various aspects of the present disclosure in one or more embodiments.

FIG. 6 shows a top view of a photomask with one opening 275 that may be used to pattern the photoresist layer 270. A top view of the device 200 of FIG. 2 is also provided. Because of the selective etch characteristics of ILD layer 250 and etch buffer layer 240, only the ILD layer 250 is etched. The ILD layer 250 is advantageously selected to have an etch rate that is greater than the etch buffer layer 240 so that despite the large opening 275, only the portions of the substrate having the ILD layer 250 are etched. In this way, a plurality of trenches can be formed using a hard mask with just one large opening. The one opening translates into multiple small details or openings instead of a single detail or opening. Forming a plurality of trenches within one hard mask opening relaxes CD constraints of the photolithography tool and provides a much simpler design than traditional layout designs with several openings.

As illustrated in FIG. 3, the different layers of the device 200 are etched through the one opening of the hard mask layer 260, resulting in a plurality of trenches 285. The CD of the trenches 285 is determined by the narrow space between adjacent upper edges of overhang components 241, rather than the space between adjacent sidewall spacers 230. The trenches 285 are self-aligned along the upper edges of adjacent overhang components 241 to ensure that there is sufficient space between gate structures 220.

The etching process is applied to etch the ILD layer 250 and to expose portions of the device 200. The different layers are removed by an etch technique such as plasma etching, dry etch, wet etch, or combinations thereof. As can be seen, with a selective etching process, the overhang components 241 may act as a barrier to prevent or significantly slow down lateral etching. With a selective and anisotropic etching process, the overhang components 241 may make trenches that are self-aligned between adjacent overhang components 241 The self-alignment of the trenches 285 ensures that adequate space exists between gate structures 220 to prevent electric shorts. When a misalignment of trench patterning occurs, the overhang components 241 and selective etching process may prevent the misalignment from transferring to the formation of the trenches, which may result in electric shorts. Instead, the overhang components 241 may keep trenches 285 at a proper distance from the gate structure 220. In another words, if there is misalignment of the patterns during photo patterning, etching does not result in shorts in the semiconductor device 200.

Referring now to FIG. 5, the etch buffer layer 240, first ILD layer 300, and second ILD layer 310 are etched through the one opening of the second ILD layer 310 to form trenches 285. The etch buffer layer 240 slows down or stops lateral etching, and provides a partially self-aligned trench etching. In the depicted embodiments, the trenches 285 are partially self-aligned to the upper edges 241 of the etch buffer layer 240. In other words, the trenches 285 are partially forced into a specific position. In this case, the trenches 285 are partially forced into a position that is between the upper edges 241 because the etch buffer layer 240 is etched at a rate is lower than the first ILD layer 300 or the second ILD layer 310.

By providing materials with different etch rate, highly selective etching may be achieved to form trenches with smaller CD. The CD of the trenches is determined by the narrow space between adjacent upper edges 241 of the etch buffer layer 240, rather than the space between adjacent etch stop layers 290. The trenches are partially self aligned along the upper edges 241 to ensure that there is sufficient space between gate structures 220. The etching process is applied to etch the etch buffer layer 240 and the first ILD layer 300 to expose portions of the device 200. The different layers are removed by an etch technique such as plasma etching, dry etch, wet etch, or combinations thereof.

In one example, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming the trenches. Other dry-etch process may be alternatively used. The mechanism of etching in each dry-etch process may have a physical basis (e.g. glow-discharge sputtering, or ion milling) or a chemical basis (e.g., in pure plasma etching) or a combination of the both (e.g., reactive ion etching or RIE). Sputtering relies on directional nature of the incident energetic ions to etch in a highly anisotropic manner In one embodiment, plasma etching is used to form the trenches. To ensure selective and anisotropic etching, certain process parameters, such as the main gas and pressure are controlled in a conventional manner. Specifically, fluorine containing gases ($C_xF_y$), such as $CF_4$, $CHF_3$, and $CH_2F_2$ may be used, as well as oxygen, argon, or combinations thereof. A low pressure is also used in the process. After etching, the hard mask and photoresist layers 280 may be removed by a process such as wet stripping or $O_2$ plasma ashing.

As can be seen, with a selective etching process, the upper edges 241 may act as a barrier to prevent or significantly slow down lateral etching. With a selective and anisotropic etching process, the upper edges 241 may make trenches that are self-aligned between adjacent upper edges 241. The partial self-alignment of the trenches ensures that adequate space exists between gate structures 220 to prevent electric shorts. When a misalignment of trench patterning occurs, the upper edges 241 and a selective etching process may prevent the misalignment from transferring to the formation of the trenches, which may result in electric shorts. Instead, the upper edges 241 may keep trenches at a proper distance from the gate structure 220. In another words, if there is misalignment of the patterns during photo patterning, etching does not result in shorts in the semiconductor device 200.

In FIG. 7, a layout design flow is illustrated. A desired layout for polygates (PO) and MD, a local inter-connection which is used to link active (OD) layers, is first designed as seen in FIG. 7a. The layout may be provided as an integrated circuit (IC) layout design in a graphic database system (GDS). The IC layout design may contain a plurality of semiconductor features. The IC layout design may be generated as a computer file, for example as a GDS type file or as an open artwork system interchange standard (OASIS) type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools. FIG. 7b illustrates a MD layout with several openings.

Figure 7B:
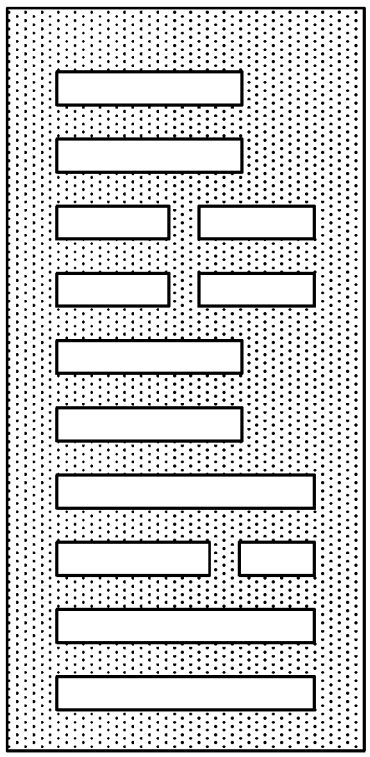
FIGS. 7a-7d are illustrations of a layout design flow according to various aspects of the present disclosure in one or more embodiments.
Figure 7D:
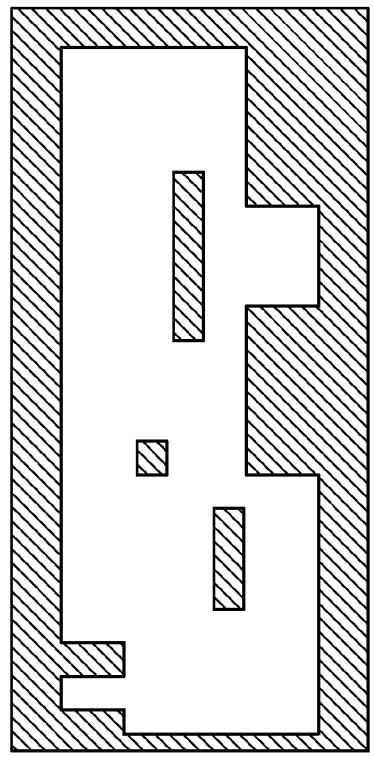
Figure 7A:
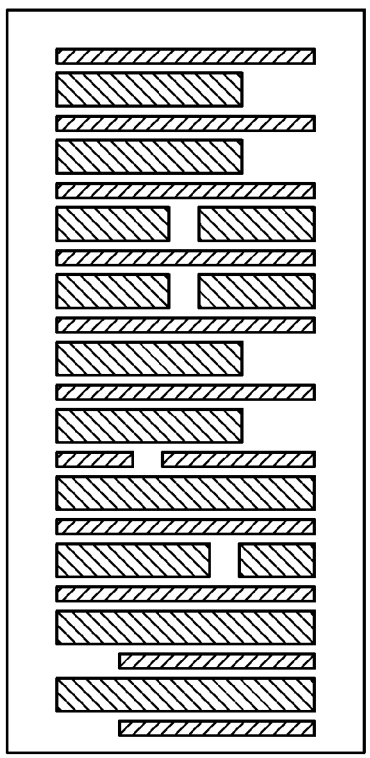
Figure 7C:
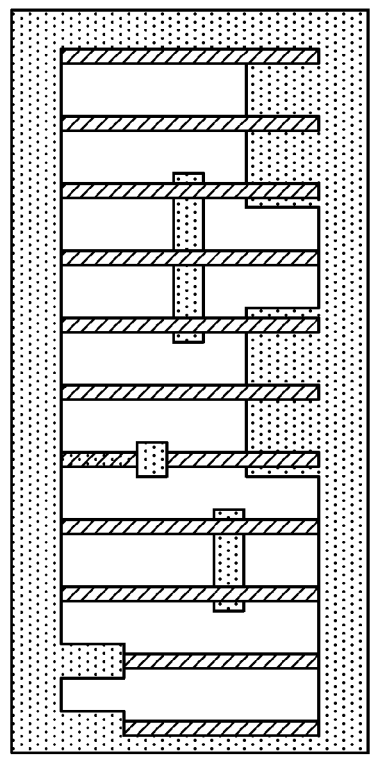

With the use of the present methods, a photomask final layout with a single opening for a design where the PO is in the center of two neighboring MDs can be formed. Shown in FIG. 7b is a layout where the PO is in the middle of two MDs. The present methods not only achieve the MD layout of FIG. 7b, but also achieve the pattern of FIG. 7c by merging the neighboring MD patterns. The one opening of the photomask final layout in FIG. 7d can advantageously form a plurality of different features, such as PO and MD. The photomask final layout forms the MDs, while allowing the POs to self-align and remain intact.

With the use of the method 100 and device 200, a CD limit of a lithography tool can be relaxed and an overlay control window can be wider. A small CD trench and improved overlap accuracy is achieved simultaneously in one simple method. A small CD trench can be achieved with a lithography tool with a larger CD limitation. This results in more efficient processes, smaller etch bias, more manufacturing flexibility, and lower costs. Advantageously, trenches 285 having a CD smaller than what is possible in conventional lithographic techniques may be formed.

Moreover, there are several benefits to using the present methods. Such benefits include a small CD, a small etch bias, a precise overlay, and cost reduction from less mask layer. The new design layout is simpler than traditional layouts because one opening can translate into multiple small details or openings.

The present methods provide immunity from misalignment because of partial self-alignment provided by the substrate. This partial self-alignment feature in combination with the simple hard mask allows CD constraints and the overlay window to be relaxed, improves the process window, and extends the life of the lithography tool.

One of the broader forms of the present disclosure involves a method of making a semiconductor device. The method includes forming a plurality of gate stacks on a substrate, forming an etch buffer layer on the substrate and on sidewalls of the gate stacks, wherein the etch buffer layer comprises upper edges and lower edges, wherein a width between adjacent upper edges is narrower than a width between adjacent lower edges, forming a dielectric material layer on the etch buffer layer, forming a hard mask layer on the substrate, wherein the mask layer includes one opening, and etching the dielectric material layer to form a plurality of trenches using the mask layer and the etch buffer layer as an etch mask.

Another one of the broader forms of the present disclosure involves another method of making a semiconductor device. The method includes providing a substrate, forming an etch buffer layer over the substrate, wherein the etch buffer layer comprises an overhang component with an upper edge that extends laterally, forming a hard mask layer on the substrate, wherein the mask layer includes one opening, and performing an etch process to form a plurality of trenches using the mask layer and the etch buffer layer as an etch mask to form a plurality of trenches.

In another embodiment, the method includes forming gate stacks on a substrate, forming an etch stop layer over the substrate and the gate stacks, forming a first dielectric material layer on the etch stop layer, forming an etch buffer layer over the etch stop layer and the first dielectric material layer, wherein the etch buffer layer comprises an upper edge disposed on an upper portion of the etch stop layer, forming a second dielectric material layer on the etch buffer layer, wherein the second dielectric material layer includes one opening, and performing an etch process to form a plurality of trenches in the first dielectric material layer using the second dielectric material layer and the etch buffer layer as an etch mask.

Other process steps may be implemented before, during and/or after the method 100. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a semiconductor device, the method comprising:
   forming a plurality of gate stacks on a substrate;
   forming an etch buffer layer on the substrate and on sidewalls of the gate stacks, wherein the etch buffer layer comprises upper edges and lower edges, wherein a width between adjacent upper edges is narrower than a width between adjacent lower edges;
   forming a dielectric material layer on the etch buffer layer;
   forming a hard mask layer on the substrate, wherein the hard mask layer includes one opening; and
   etching the dielectric material layer to form a plurality of trenches using the hard mask layer and the etch buffer layer as an etch mask.

2. The method of claim 1, wherein the plurality of trenches are formed simultaneously through the one opening of the hard mask layer.

3. The method of claim 1, wherein the trenches are defined by a width between adjacent upper edges of the etch buffer layer.

4. The method of claim 3, wherein the plurality of trenches formed through the one opening are formed by a partially self-aligned etch.

5. The method of claim 1, wherein the etch buffer layer is formed by plasma-enhanced chemical vapor deposition, physical vapor deposition, chemical vapor deposition, or a combination thereof.

6. The method of claim 1, wherein the hard mask layer is patterned using a lithography process.

7. The method of claim 1, further comprising filling the trenches with a conductive material to form a local interconnection to connect active regions and gates.

8. The method of claim 1, further comprising forming an interlayer dielectric (ILD) layer over the etch buffer layer, wherein the ILD layer has a higher etch rate than the etch buffer layer.

9. A method of making a semiconductor device, the method comprising:
- providing a substrate;
- forming an etch buffer layer over the substrate, wherein the etch buffer layer comprises an overhang component with an upper edge that extends laterally;
- forming a hard mask layer on the substrate, wherein the hard mask layer includes one opening; and
- performing an etch process to form a plurality of trenches using the hard mask layer and the etch buffer layer as an etch mask, wherein the plurality of trenches are formed simultaneously through the one opening of the hard mask layer.

10. The method of claim 9, wherein the plurality of trenches are defined by a width between adjacent overhang components of the etch buffer layer.

11. The method of claim 10, wherein the plurality of trenches are formed in a dielectric material layer through the one opening by the etch process that is a partially self-aligned etch.

12. The method of claim 9, wherein the etch buffer layer is formed by atomic vapor deposition.

13. The method of claim 9, wherein the hard mask layer is patterned to form the opening using a patterned photoresist layer and local inter-connection features are formed in the trenches to connect active regions and gates.

14. A method of making a semiconductor device, the method comprising:
- forming gate stacks on a substrate;
- forming an etch stop layer over the substrate and the gate stacks;
- forming a first dielectric material layer on the etch stop layer;
- forming an etch buffer layer over the etch stop layer and the first dielectric material layer, wherein the etch buffer layer comprises an upper edge disposed on an upper portion of the etch stop layer;
- forming a second dielectric material layer on the etch buffer layer, wherein the second dielectric material layer includes one opening; and
- performing an etch process to form a plurality of trenches in the first dielectric material layer using the second dielectric material layer and the etch buffer layer as an etch mask.

15. The method of claim 14, wherein the plurality of trenches are formed simultaneously through the one opening of the second dielectric material layer.

16. The method of claim 14, wherein the plurality of trenches are defined by a width between adjacent upper edges of the etch buffer layer.

17. The method of claim 16, wherein the etch process forms the trenches in the first dielectric material layer and self-aligned with the upper edge of the etch buffer layer.

18. The method of claim 14, wherein the etch buffer layer is formed by atomic vapor deposition.

19. The method of claim 14, wherein the forming the second dielectric material layer includes:
- depositing the second dielectric material layer on the etch buffer layer; and
- patterning the second dielectric material layer to form the one opening by a lithography process.

* * * * *